(12) United States Patent
Liaw

(10) Patent No.: US 11,688,456 B2
(45) Date of Patent: Jun. 27, 2023

(54) GATE-ALL-AROUND MEMORY DEVICES

(71) Applicant: Taiwan Semiconductor Manufacturing Co., Ltd., Hsinchu (TW)

(72) Inventor: Jhon Jhy Liaw, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/397,137

(22) Filed: Aug. 9, 2021

(65) Prior Publication Data

US 2021/0366536 A1 Nov. 25, 2021

Related U.S. Application Data

(62) Division of application No. 16/547,858, filed on Aug. 22, 2019, now Pat. No. 11,087,831.

(51) Int. Cl.
| | |
|---|---|
| *G11C 11/412* | (2006.01) |
| *H01L 27/092* | (2006.01) |
| *H01L 27/088* | (2006.01) |
| *H01L 29/78* | (2006.01) |
| *H10B 10/00* | (2023.01) |

(52) U.S. Cl.
CPC ........ *G11C 11/412* (2013.01); *H01L 27/0886* (2013.01); *H01L 27/0924* (2013.01); *H01L 29/785* (2013.01); *H10B 10/12* (2023.02); *H01L 2029/7858* (2013.01)

(58) Field of Classification Search
CPC ............ H01L 27/0886; H01L 27/0924; H01L 27/1104; H01L 29/785; G11C 11/412

USPC ........................................................ 257/365
See application file for complete search history.

(56) References Cited

U.S. PATENT DOCUMENTS

| | | | |
|---|---|---|---|
| 9,012,287 B2 | 4/2015 | Liaw | |
| 10,290,546 B2 | 5/2019 | Chiang et al. | |
| 2014/0003133 A1 | 1/2014 | Lin | |
| 2014/0145248 A1 | 5/2014 | Cheng | |
| 2015/0243667 A1 | 8/2015 | Liaw | |
| 2016/0027499 A1 | 1/2016 | Liaw | |
| 2017/0077106 A1* | 3/2017 | Liaw | .................. H01L 27/1116 |
| 2018/0019316 A1 | 1/2018 | Cheng | |
| 2018/0138185 A1 | 5/2018 | Hsu | |
| 2018/0233570 A1* | 8/2018 | Hellings | ............. H01L 29/7851 |
| 2018/0342596 A1 | 11/2018 | Lee et al. | |
| 2019/0067417 A1 | 2/2019 | Ching | |

* cited by examiner

*Primary Examiner* — Dzung Tran
(74) *Attorney, Agent, or Firm* — Haynes and Boone, LLP

(57) ABSTRACT

Static Random Access Memory (SRAM) cells and memory structures are provided. An SRAM cell according to the present disclosure includes a first pull-up gate-all-around (GAA) transistor and a first pull-down GAA transistor coupled to form a first inverter, a second pull-up GAA transistor and a second pull-down GAA transistor coupled to form a second inverter, a first pass-gate GAA transistor coupled to an output of the first inverter and an input of the second inverter, a second pass-gate GAA transistor coupled to an output of the second inverter and an input of the first inverter; a first dielectric fin disposed between the first pull-up GAA transistor and the first pull-down GAA transistor, and a second dielectric fin disposed between the second pull-up GAA transistor and the second pull-down GAA transistor.

20 Claims, 7 Drawing Sheets

GATE-ALL-AROUND MEMORY DEVICES

PRIORITY DATA

This application is a divisional application of U.S. patent application Ser. No. 16/547,858, filed Aug. 22, 2019, the entirety of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and gate-all-around (GAA) transistors (both also referred to as non-planar transistors) are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). Compared to planar transistors, such configuration provides better control of the channel and drastically reduces SCEs (in particular, by reducing sub-threshold leakage (i.e., coupling between a source and a drain of the FinFET in the "off" state)). A GAA transistor has a gate structure that can extend, partially or fully, around a channel region to provide access to the channel region on two or more sides. The channel region of the GAA transistor may be formed from nanowires, nanosheets, other nanostructures, and/or other suitable structures. In some implementations, such channel region includes multiple nanostructures (which extend horizontally, thereby providing horizontally-oriented channels) vertically stacked. Such GAA transistor can be referred to as a vertically-stacked horizontal GAA (VGAA) transistor.

A static random access memory (SRAM) cell has become a popular storage unit of high speed communication, high-density storage, image processing and system-on-chip (SOC) products. Although existing SRAM cells have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1:
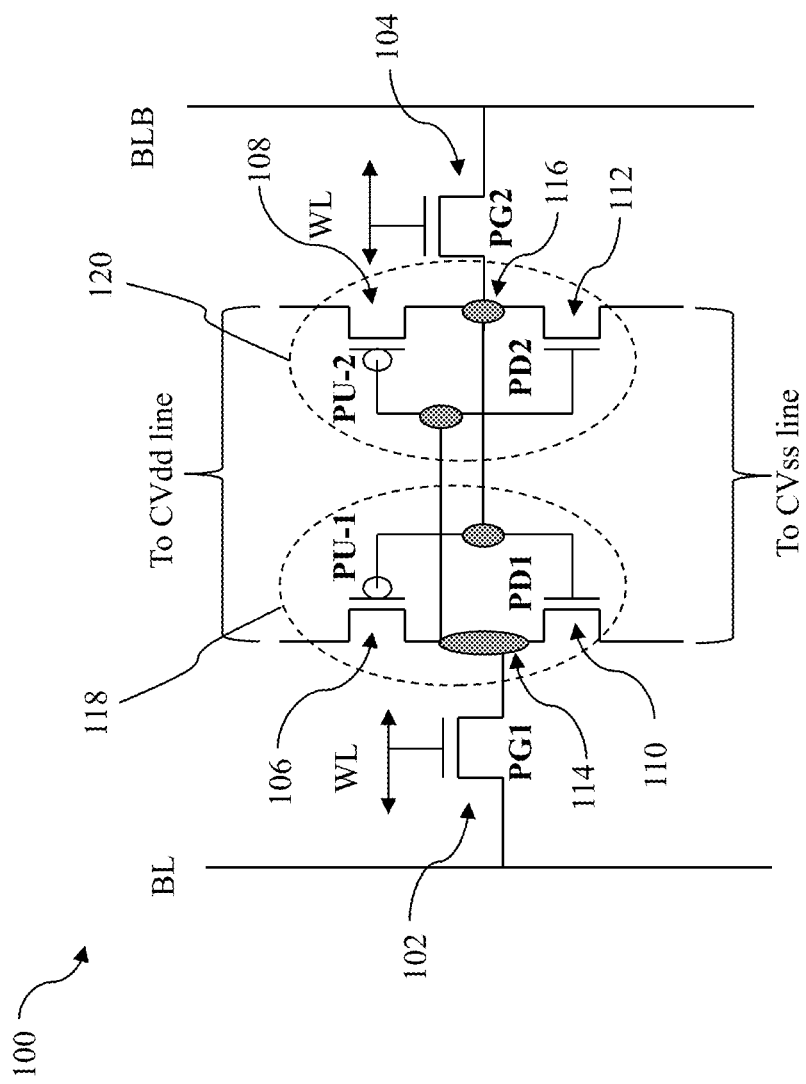
FIG. 1 illustrates a circuit diagram of an SRAM cell.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure relates to a memory device, and more particularly, to a SRAM cell and a memory structure. An SRAM cell or a memory structure according to embodiments of the present disclosure includes GAA transistors separated by dielectric fins. In one embodiment, an SRAM cell includes a first pass-gate GAA transistor and a first pull-down GAA transistor formed over a first fin-shaped vertical stack of channel members, a first pull-up GAA transistor formed over a second fin-shaped vertical stack of channel members, a second pull-up GAA transistor formed over a third fin-shaped vertical stack of channel members, and a second pull-down GAA transistor and a second pass-gate GAA transistor formed over a fourth fin-shaped vertical stack of channel members. The first, second, third, and fourth fin-shaped vertical stacks of channel members are interleaved by five dielectric fins. Epitaxial source/drain features of all the GAA transistors in the SRAM cell are confined by the dielectric fins. In that regard, epitaxial source/drain features of all the GAA transistors in the SRAM may be in contact with the dielectric fins. While the present disclosure will be described with respect to embodiments in SRAM cells formed of GAA transistors, it should be understood that embodiments of the present disclosure may be applicable to a variety of semiconductor devices.

Static random-access memory (SRAM) is a type of volatile semiconductor memory that uses bi-stable latching circuitry to store each bit. Each bit in an SRAM is stored on four transistors (first pull-up transistor (PU-1), second pull-up transistor (PU-2), first pull-down transistor (PD-1), and second pull-down transistor (PD-2)) that form two cross-coupled inverters. This memory cell has two stable states which are used to denote 0 and 1. Two additional access transistors (first pass-gate transistor (PG-1) and second pass-gate transistor (PG-2)) serve to control the access to a storage cell during read and write operations. A typical SRAM cell includes six-transistors (6T) to store each memory bit. FIG. 1 illustrates a circuit diagram of a SRAM cell 100 in accordance with some embodiments of the present disclosure. In some instances, the SRAM cell 100 in FIG. 1 includes six (6) transistors and may be referred to as a single-port SRAM cell 100 or a 6T SRAM cell 100. It is noted, even though the embodiments of the present disclosure are described in conjunction with 6T SRAM cells, the present disclosure is not so limited. The present disclosure may be applicable to SRAM cells including more transistors, such as 7T, 8T, 9T, or 10T, that may be single-port, dual-port, or multi-port.

The SRAM cell 100 includes first and second pass-gate transistors (PG-1) 102 and (PG-2) 104, first and second pull-up transistors (PU-1) 106 and (PU-2) 108, and first and second pull-down transistors 110 (PD-1) and 112 (PD-2). In SRAM cell 100, each of the pass-gate transistors, pull-up transistors and pull-down transistors may be a multi-gate transistor, such as a GAA transistor. The gates of the first and second pass-gate transistors 102 and 104 are electrically coupled to word-line (WL) that determines whether the SRAM cell 100 is selected or not. In the SRAM cell 100, a memory bit (e.g., a latch or a flip-flop) is formed of the first and second pull-up transistors 106 and 108 and the first and second pull-down transistors 110 and 112 to store a bit of data. The complementary values of the bit are stored in a first storage node 114 and a second storage node 116. The stored bit can be written into, or read from, the SRAM cell 100 through Bit-line (BL) and Bit-Line Bar (BLB). In this arrangement, the BL and BLB may carry complementary bit-line signals. The SRAM cell 100 is powered through a voltage bus CVdd that has a positive power supply voltage and is also connected to a ground potential CVss.

The SRAM cell 100 includes a first inverter 118 formed of the first pull-up (PU-1) transistor 106 and the first pull-down transistor (PD-1) 110 as well as a second inverter 120 formed of the second pull-up transistor (PU-2) 108 and the second pull-down transistor (PD-2) 112. The first inverter 118 and the second inverter 120 are coupled between the voltage bus CVdd and the ground potential CVss. As shown in FIG. 1, the first inverter 118 and the second inverter 120 are cross-coupled. That is, the first inverter 118 has an input coupled to the output of the second inverter 120. Likewise, the second inverter 120 has an input coupled to the output of the first inverter 118. The output of the first inverter 118 is referred to as the first storage node 114. Likewise, the output of the second inverter 120 is referred to as the second storage node 116. In a normal operating mode, the first storage node 114 is in the opposite logic state as the second storage node 116. By employing the two cross-coupled inverters, the SRAM cell 100 can hold the data using a latched structure so that the stored data will not be lost without applying a refresh cycle as long as power is supplied through Vdd.

In an SRAM array formed of a plurality of the SRAM cells 100, the SRAM cells 100 are arranged in rows and columns. The columns of the SRAM array are formed by a bit line pairs, namely a bit line BL and a bit line bar BLB. The cells of the SRAM array are disposed between the respective bit line pairs. As shown in FIG. 1, the SRAM cell 100 is placed between the bit line BL and the bit line BLB. As shown in FIG. 1, the SRAM cell 100 further includes a first pass-gate transistor (PG-1) 102 connected between the bit line BL and the output 114 (i.e. first storage node 114) of the first inverter 118. The SRAM cell 100 further includes a second pass-gate transistor (PG-2) 104 connected between the bit line bar BLB and the output 116 (i.e. second storage node 116) of the second inverter 120. The gates of the first pass-gate transistor (PG-1) 102 and the second pass-gate transistor (PG-2) 104 are connected to a word line (WL), which connects SRAM cells in a row of the SRAM array.

In operation, if the first and second pass-gate transistors (PG-1) 102 and (PG-2) 104 are inactive, the SRAM cell 100 will maintain the complementary values at first and second storage nodes 114 and 116 indefinitely as long as power is provided through CVdd. This is so because each inverter of the pair of cross coupled inverters drives the input of the other, thereby maintaining the voltages at the storage nodes 114 and 116. This situation will remain stable until the power is removed from the SRAM cell 100, or, a write cycle is performed changing the stored data at the storage nodes 114 and 116.

During a WRITE operation, bit line BL and bit line bar BLB are set to opposite logic values according to the new data that will be written into the SRAM cell 100. For example, in an SRAM write operation, a logic state "1" stored in a data latch of the SRAM cell 100 can be reset by setting BL to "0" and BLB to "1". In response to a binary code from a row decoder (not shown), a word line coupled to the first and second pass-gate transistors (PG-1) 102 and (PG-2) 104 of the SRAM cell 100 is asserted to select the memory cell and turn on the first and second pass-gate transistors (PG-1) 102 and (PG-2)104. As a result, the first and second storage nodes 114 and 116 are connected to BL and BLB respectively. Furthermore, the first storage node 114 of the data latch is discharged by BL to "0" and the second storage node 116 of the data latch is charged by BLB to "1". As a result, the new data logic "0" is latched into the SRAM cell 100.

In a READ operation, both BL and BLB of the SRAM cell 100 are pre-charged to a voltage approximately equal to the operating voltage of the memory bank in which the SRAM cell 100 is located. In response to a binary code from the row decoder, a word line coupled to the first pass-gate transistor (PG-1) 102 and the second pass-gate transistor (PG-2) 104 of the SRAM cell 100 is asserted so that the data latch is selected to proceed to a READ operation.

During a READ operation, through a turned on first and second pass-gate transistors (PG-1) 102 and (PG-2)104, one bit line coupled to the storage node storing a logic "0" is discharged to a lower voltage. Meanwhile, the other bit line remains the pre-charged voltage because there is no discharging path between the other bit line and the storage node storing a logic "1". The differential voltage between BL and BLB is detected by a sense amplifier (not shown). Furthermore, the sense amplifier amplifies the differential voltage and reports the logic state of the memory cell via a data buffer.

Figure 2:
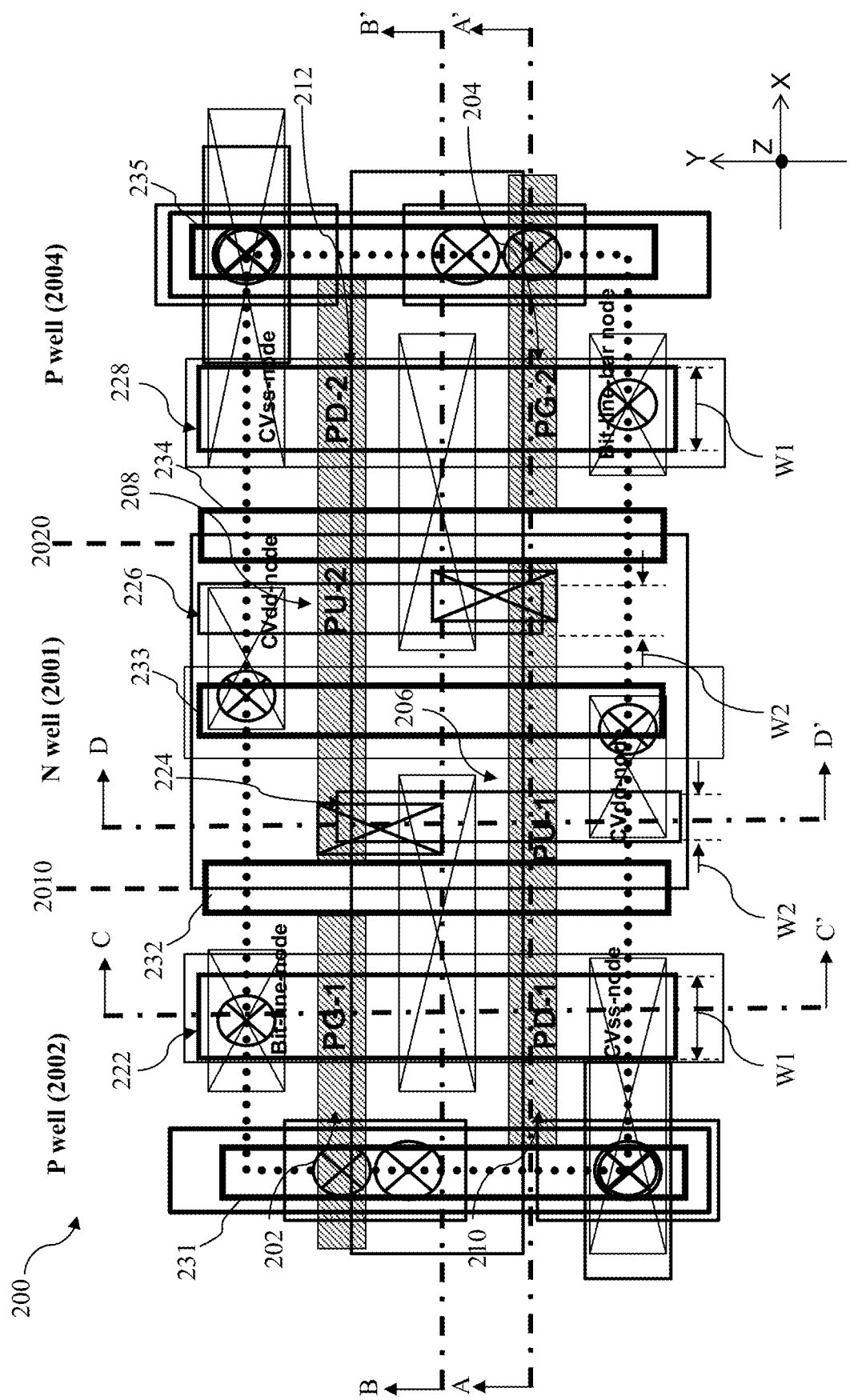
FIG. 2 illustrates a layout of an SRAM cell in accordance with some embodiments of the present disclosure.

Referring now to FIG. 2, shown therein is a layout of a SRAM cell 200 in accordance with some embodiments of the present disclosure. Similar to SRAM cell 100 illustrated in the circuit diagram in FIG. 1, the SRAM cell 200 includes six (6) transistors functioning as the first pass-gate transistor 202, the second pass-gate transistor 204, the first pull-up transistor 206, the second pull-up transistor 208, the first pull-down transistor 210, and the second pull down transistor 212. In at least some embodiments, the SRAM cell 100 in FIG. 1 may be implemented as the SRAM cell 200 in FIG. 2.

In some implementations represented in FIG. 2, the SRAM cell 200 is formed over an n-type well 2001 (or n-type region 2001, N well 2001) sandwiched between two p-type wells 2002 and 2004 (or p-type regions 2002 and 2004, P wells 2002 and 2004). The N well 2001 and P wells 2002, 2004 are formed over a substrate (not shown in FIG. 2, shown as substrate 201 in FIG. 3). In some embodiments, as shown in FIG. 2, the first pass-gate transistor 202, the first pull-down transistor 210, the second pull-down transistor 212, and the second pass-gate transistor 204 may be formed in the P wells 2002 and 2004; and the first pull-up transistor 206 and the second pull-up transistor 208 are formed in the N well 2001. In these embodiments, the first pass-gate transistor 202, the first pull-down transistor 210, the second pull-down transistor 212, and the second pass-gate transistor 204 are n-type GAA transistors; and the first pull-up transistor 206 and the second pull-up transistor 208 are p-type GAA transistors.

In some alternative implementations not illustrated in FIG. 2, the SRAM cell 200 is formed over a P well sandwiched between two N wells. In those implementations, the first and second pass-gate transistors and the first and second pull-down transistors are formed in the N wells and the first and second pull-up transistors are formed in the P well between the two N wells. In those implementations, the first and second pass-gate transistors and the first and second pull-down transistors are p-type GAA transistors; and the first and second pull-up transistors are n-type nanowire GAA transistors.

In some embodiments, the SRAM cell 200 includes four fin-shaped vertical stacks—a first fin-shaped vertical stack 222, a second fin-shaped vertical stack 224, a third fin-shaped vertical stack 226, and a fourth fin-shaped vertical stack 228. The first fin-shaped vertical stack 222 is formed over the P well 2002 and forms the channel regions of the first pass-gate transistor 202 and the first pull-down transistor 210. The second fin-shaped vertical stack 224 and third fin-shaped vertical stack 226 are formed over the N well 2001 and form the channel regions of the first pull-up transistor 206 and the second pull-up transistor 208, respectively. The fourth fin-shaped vertical stack 228 is formed over the P well 2004 and forms the channel regions of the second pull-down transistor 212 and the second pass-gate transistor 204. In some implementations, each of the first, second, third, and fourth fin-shaped vertical stacks 222, 224, 226, and 228 may include about two to about ten channel members.

In some instances, the fin-shaped vertical stacks may be formed by depositing or epitaxially growing alternating layers of two different semiconductor materials, recessing the alternating layers to form fin-shaped structures, and selectively removing layers formed of one of the two semiconductor materials. For example, alternating layers of epitaxially grown silicon (Si) and silicon germanium (SiGe) can be formed on a substrate. The alternating layers may then be recessed to form fin-shaped structures that include stacks of interleaved Si strips and SiGe stripes. In processes to form a channel region of a transistor in a SRAM cell, depending on the conductivity type of the transistor, the channel region of the fin-shaped structures may undergo different etching processes to selectively remove the Si strips or the SiGe strips, releasing Si channel members or SiGe channel members extending between the source/drain regions. The channel members may assume different shapes and dimensions and may be referred to as nanostructure, nanowires, or nanosheets. In some embodiments, the channel members may be doped, either in-situ during epitaxial growing or by implantation. These fin-shaped structures are separated by an isolation feature, such as a shallow trench isolation (STI) feature. In some implementations, each of the fin-shaped vertical stacks may include a top portion formed from the alternating layers and a base portion formed from the substrate. The base portions of the fin-shaped vertical stacks have a shape of a fin and may be referred to as fin structures. The base portions of the fin-shaped vertical stacks may be substantially buried in the isolation feature and top ends of the base portions of the fin-shaped vertical stacks may be level with a top surface of the isolation feature. The top portions of the fin-shaped vertical stacks extend from and rise above the isolation feature.

In some embodiments illustrated in FIG. 2, the first fin-shaped vertical stack 222, the second fin-shaped vertical stack 224, the third fin-shaped vertical stack 226, and the fourth fin-shaped vertical stack 228 are interleaved by dielectric fins. In these embodiments, the first fin-shaped vertical stack 222 is disposed between a first dielectric fin 231 and a second dielectric fin 232; the second fin-shaped vertical stack 224 is disposed between the second dielectric fin 232 and a third dielectric fin 233; the third fin-shaped vertical stack 226 is disposed between the third dielectric fin 233 and a fourth dielectric fin 234; and the fourth fin-shaped vertical stack 228 is disposed between the fourth dielectric fin 234 and the fifth dielectric fin 235. The first dielectric fin 231 and the fifth dielectric fin 235 may function as boundaries or ends of the SRAM cell 200. Put differently, one lateral side of the first dielectric fin 231 along the Y direction is adjacent the SRAM cell 200 and the other lateral side of the first dielectric fin 231 along the Y direction is adjacent to another SRAM cell adjacent the SRAM cell 200. Similarly, one lateral side of the fifth dielectric fin 235 along the Y direction is adjacent the SRAM cell 200 and the other lateral side of the fifth dielectric fin 235 along the Y direction is adjacent to another SRAM cell adjacent the SRAM cell 200.

Reference is still made to FIG. 2. The channel members in the first fin-shaped vertical stack 222 form channel regions of the first pass-gate transistor (PG-1) 202 and the first pull-down transistor (PD-1) 210. The channel members in the second fin-shaped vertical stack 224 form channel regions of the first pull-up transistor (PU-1) 206. The channel members in the third fin-shaped vertical stack 226 form channel regions of the second pull-up transistor (PU-2) 208. The channel members in the fourth fin-shaped vertical stack 228 form channel regions of the second pull-down transistor (PD-2) 212 and the second pass-gate transistor (PG-2) 204. In some embodiments represented in FIG. 2, the second dielectric fin 232 is disposed between the first pull-down transistor (PD-1) 210 and the first pull-up transistor (PU-1) 206. The P well 2002 and the N well 2001 meet at a first interface 2010. The second dielectric fin 232 is disposed over the first interface 2010. Similarly, the fourth dielectric fin 234 is disposed between the second pull-up transistor (PU-2) 208 and the second pull-down transistor (PD-2) 212. The P well 2004 and the N well 2001 meet at a second interface 2020. The fourth dielectric fin 234 is disposed over the second interface 2020.

Reference is still made to FIG. 2. The first fin-shaped vertical stack 222 is disposed over the P well 2002. The second fin-shaped vertical stack 224 and the third fin-shaped vertical stack 226 are disposed over the N well 2001. The fourth fin-shaped vertical stack 228 is disposed over the P well 2004. It follows that the first pass-gate transistor (PG-1) 202, the first pull-down transistor (PD-1) 210, the second pass-gate transistor (PG-2) 204, the second pull-down transistor (PD-1) 212 may be n-type GAA transistors. The first pull-up transistor (PU-1) 206 and the second pull-up transistor (PU-2) 208 may be p-type GAA transistors. In some embodiments, the n-type GAA transistors require wider channel widths than the p-type GAA transistors to increase switching speed. In those embodiments, each of the first fin-shaped vertical stack 222 and fourth fin-shaped vertical stack 228 has a first width W1 along the X direction and each of the second fin-shaped vertical stack 224 and the third fin-shaped vertical stack 226 has a second width W2 along the X direction. In some instances, a ratio of the first width W1 to the second width W2 (W1/W2) is between about 1 and about 5, including between about 1.1 and about 3.0. In some implementations, the first width W1 and the second width W2 may be in the range between about 4 nm and about 60 nm.

Figure 3:
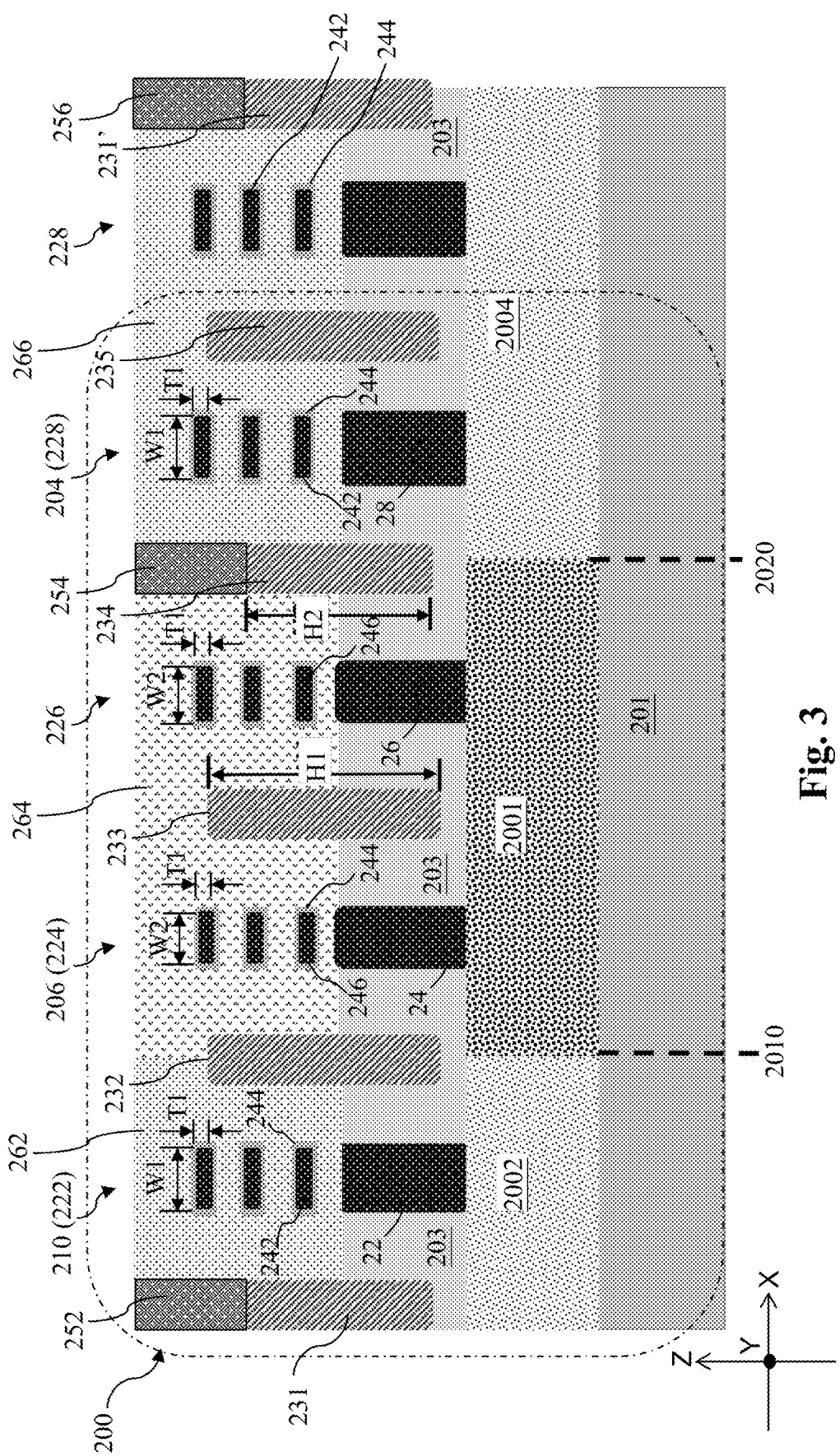
FIG. 3 illustrates a cross-sectional view of the layout in FIG. 2 along line A-A', according to various aspects of the present disclosure.
Figure 4:
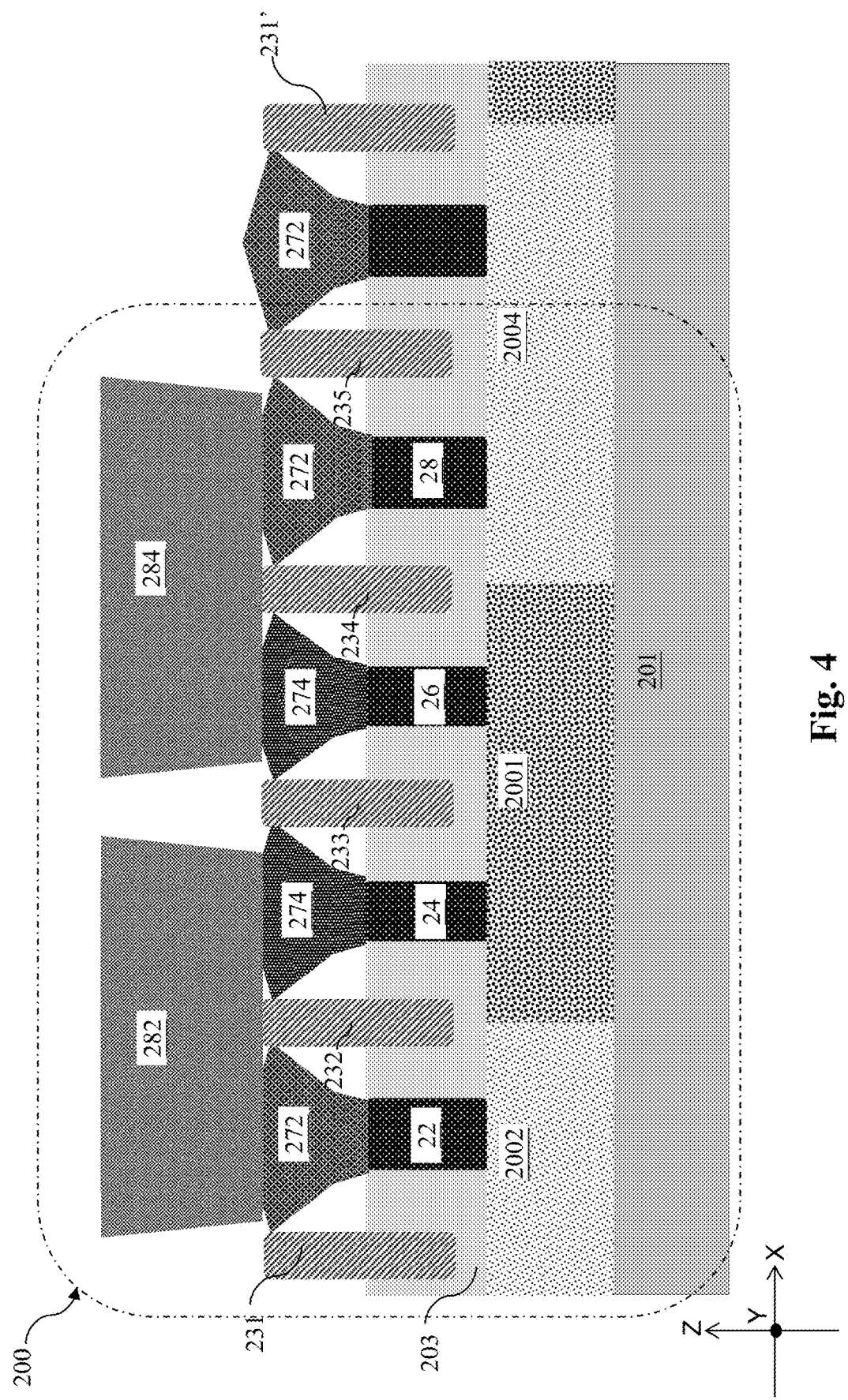
FIG. 4 illustrates a cross-sectional view of the layout in FIG. 2 along line B-B', according to various aspects of the present disclosure.
Figures 5, 6:
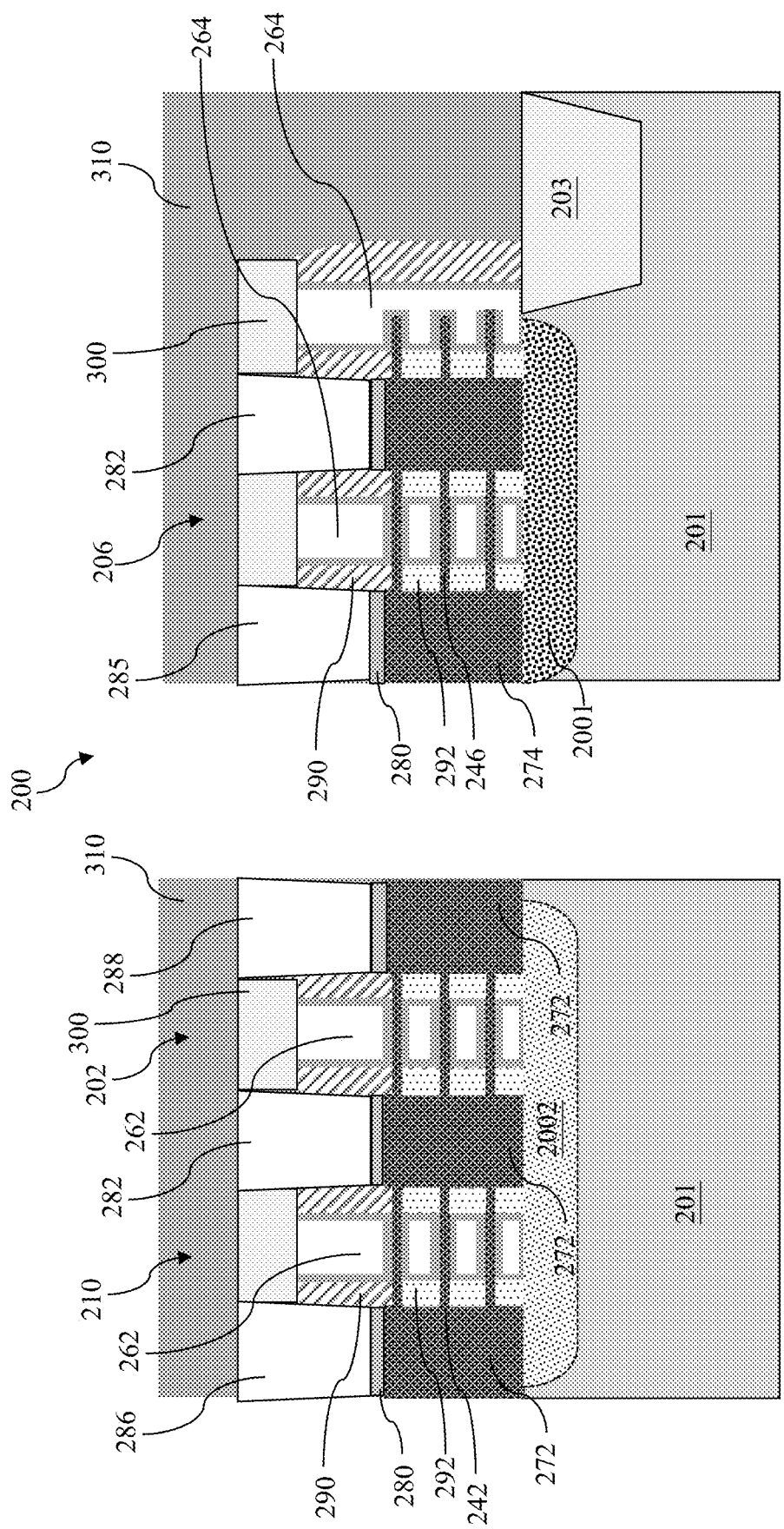
FIG. 5 illustrates a cross-sectional view of the layout in FIG. 2 along line C-C', according to various aspects of the present disclosure.
FIG. 6 illustrates a cross-sectional view of the layout in FIG. 2 along line D-D', according to various aspects of the present disclosure.

Different cross-sectional views of the SRAM cell 200 are provided to illustrate the structural details of the SRAM cell 200. For example, FIG. 3 illustrates a cross-sectional view of SRAM cell 200 in FIG. 2 along line A-A'. FIG. 4 illustrates a cross-sectional view of the SRAM cell 200 in FIG. 2 along line B-B'. FIG. 5 illustrates a cross-sectional view of the SRAM cell 200 in FIG. 2 along line C-C'. FIG. 6 illustrates a cross-sectional view of the SRAM cell 200 in FIG. 2 along line D-D'.

Reference is now made to FIG. 3, which illustrates a cross-sectional view of the SRAM cell 200 in FIG. 2 along line A-A'. Line A-A' in FIG. 2 extends through the first dielectric fin 231, the channel region of the first pull-down transistor (PD-1) 210 (which is formed over the first fin-shaped vertical stack 222), the second dielectric fin 232, the first pull-up transistor (PU-1) 206, the third dielectric fin 233, the third fin-shaped vertical stack 226, the fourth dielectric fin 234, the second pass-gate transistor (PG-2) 204 (which is formed over the fourth fin-shaped vertical stack 228), and the fifth dielectric fin 235. As shown in FIG. 3, the first pull-down transistor (PD-1) 210 includes first channel members 242 disposed over the first fin structure 22. The first pull-up transistor (PU-1) 206 includes second channel members 246 disposed over the second fin structure 24. The third fin-shaped vertical stack 226 includes second channel members 246 disposed over the third fin structure 26. The second pass-gate transistor (PG-2) 204 includes first channel members 242 disposed over the fourth fin structure 28. The first channel members 242 are channel members formed from the first fin-shaped vertical stack 222 over the P well 2002 and the fourth fin-shaped vertical stack 228 over the P well 2004. The first channel members 242 have the first width W1 and a firth thickness T1. The second channel members 246 are channel members formed from the second fin-shaped vertical stack 224 and the third fin-shaped vertical stack 226 over the N well 2001. The second channel members 246 have the second width W2 and a second thickness T2. In some instances, a ratio of the first width W1 to the second width W2 (W1/W2) is between about 1 and about 5, including between about 1.1 and about 3.0. The first thickness T1 is identical or substantially identical to the second thickness T2. In some implementations, the first thickness T1 and the second thickness T2 may be in the range between about 3 nm and about 10 nm and the first width W1 and the second width W2 may be in the range between about 6 nm and about 60 nm.

Figure 7:
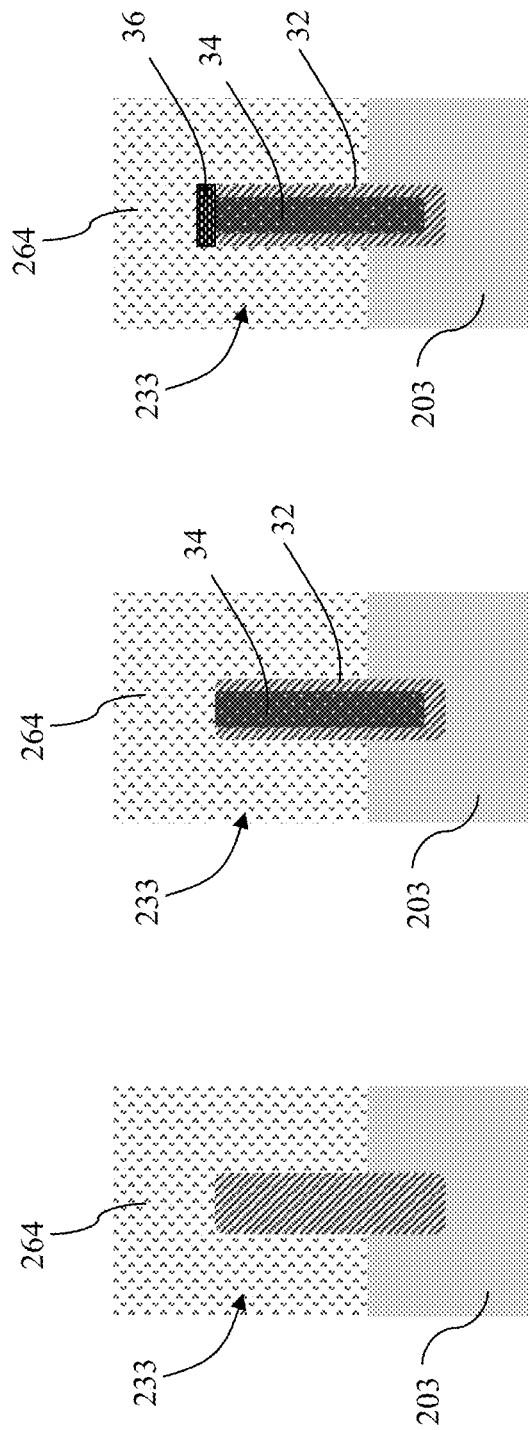
FIGS. 7A, 7B and 7C illustrate schematic cross-sectional views of a dielectric fin, according to various aspects of the present disclosure.

An isolation feature 203 is disposed among the first fin structure 22, second fin structure 24, the third fin structure 26, and the fourth fin structure 28. The isolation feature 203 is disposed between adjacent fin structures. In some embodiments, a top surface of the isolation feature 203 is substantially level with each of the fin structures 22, 24, 26 and 28. The isolation feature 203 may be referred to as a shallow trench isolation (STI) feature 203 and may include silicon oxide. Each of the dielectric fins shown in FIG. 3, such as the first dielectric fin 231, the second dielectric fin 232, the third dielectric fin 233, the fourth dielectric fin 234, and the fifth dielectric fin 235 are partially buried in the isolation feature 203. That is, each of the dielectric fins has a lower portion that is disposed or planted in the isolation feature 203 and an upper portion that rises above the top surface of the isolation feature 203. Each of the dielectric fins may have a single-layer structure or a multi-layer structure. Different embodiments of the dielectric fins are illustrated in FIGS. 7A, 7B and 7C, using the third dielectric fin 233 as an example. In some embodiments represented in FIG. 7A, the third dielectric fin 233 has a single-layer structure and may be formed of silicon oxycarbide, silicon oxynitride, silicon oxycarbonitride, silicon nitride, aluminum oxide, yttrium oxide, tantalum oxide, titanium oxide, hafnium oxide, or zirconium oxide. In some alternative embodiments, the third dielectric fin 233 has a multi-layer structure. In FIG. 7B, the third dielectric fin 233 includes two layers—the first layer 32 and the second layer 34. In the embodiment shown in FIG. 7B, the second layer 34 is wrapped around by or disposed in the first layer 32. In some implementations, the first layer 32 may be formed of silicon nitride and the second layer 34 may be formed of a high-k dielectric material, such as aluminum oxide, yttrium oxide, tantalum oxide, titanium oxide, hafnium oxide, or zirconium oxide. As used here, a high-k dielectric material has a dielectric constant greater than 3.9, which is the dielectric constant of silicon oxide; and a low-k dielectric material has dielectric constant equal to or smaller than 3.9. In still some alternative embodiments represented in FIG. 7C, the third dielectric fin 233 may include a cap layer 36. The cap layer 36 may be formed of silicon oxide, silicon oxynitride, silicon carbide, silicon oxycarbonitride, or silicon oxycarbide. It is noted that in most embodiments, the dielectric fins are largely formed of high-k dielectric material as they tend to have slower etching rates. The third dielectric fin 233 is merely used as an example in FIGS. 7A, 7B and 7C to demonstrate example structures of a dielectric fin of the present disclosure. Implementations of the embodiments in FIGS. 7A-7C to the other dielectric fins are fully envisioned by the present disclosure.

With respect to metal gate stacks, the line A-A' in FIG. 2 passes through several gate stack segments. As illustrated in FIG. 3, the line A-A' pass through a first gate stack segment 262, a second gate stack segment 264, and a third gate stack segment 266. In some embodiments, the first gate stack segment 262, the second gate stack segment 264 and the third gate stack segment 266 have a uniform construction and composition even though these gate stack segments are disposed across n-type GAA transistor regions and p-type GAA transistor regions. In these embodiments, each of the first gate stack segment 262, the second gate stack segment 264 and the third gate stack segment 266 includes a gate dielectric layer 244, work function metal layers, and fill metal layers. The work function metal layers and the fill metal layers may be collectively referred to as a gate electrode. The gate electrode may include materials selected from titanium nitride, tantalum nitride, titanium aluminide, titanium aluminum nitride, tantalum aluminide, tantalum aluminum nitride, tantalum aluminum carbide, tantalum carbonitride, aluminum, tungsten, copper, cobalt, nickel, platinum, or a combination thereof. The gate dielectric layer 244 may include an interfacial layer and at least one high-k dielectric layer. In some alternative embodiments, the first gate stack segment 262 and the third gate stack segment 266, on the one hand, and the second gate stack segment 264, on the other hand, have different constructions and compositions. In these alternative embodiments, the first gate stack segment 262 and the third gate stack segment 266, being the gate stacks of n-type GAA transistors, may have n-type work function metal layers. Similarly, the second gate stack segment 264, being the gate stack of p-type GAA transistors, may have p-type work function metal layers. Formation of the different work function metal layers may require several iterations of material deposition and etching back processes. The dielectric fins may serve as a lateral divider and etch stop feature in these alternative embodiments. They serve as a lateral divider when selective deposition of material in respective p-type or n-type device region. They serve as a lateral etch stop feature when etching back is needed. In some implementations, different high-k dielectric layer schemes may be implementation to n-type and p-type device regions to introduce different threshold voltages. In those implementations, dielectric fins may also serve as a lateral divider and etch stop feature for similar reasons.

In some embodiments, the gate stack segments may be subject to metal gate cut processes where gate cut openings are formed to severe gate stack segments and a reverse material is filled in the gate cut openings to form gate cut dielectric features (or gate end features). FIG. 3 illustrates a first gate cut dielectric feature 252, a second gate cut dielectric feature 254, and a third gate cut dielectric feature 256. As described above, the first gate cut dielectric feature 252, the second gate cut dielectric feature 254, and the third gate cut dielectric feature 256 are formed in metal gate cut processes and may be formed of high-k dielectric materials, such as silicon nitride, aluminum oxide, yttrium oxide, tantalum oxide, titanium oxide, hafnium oxide, or zirconium oxide. In some implementations, the gate cut openings may be made to coincide with the dielectric fins such that the dielectric fins may serve as an etch stop for the metal gate cut process. In those implementations, the gate cut dielectric features may coincide with the dielectric fins and may land right on top of the dielectric fins. For example, the first gate cut dielectric feature 252 is disposed over the first dielectric fin 231, the second gate cut dielectric feature 254 is disposed over the fourth dielectric fin 234, and the third gate cut dielectric feature 256 is disposed over a dielectric fin 231' in an adjacent SRAM cell. In FIG. 3, the second dielectric fin 232 is disposed over the first interface 2010 and the fourth dielectric fin 234 is disposed over the second interface 2020. The second gate cut dielectric feature 254 is disposed over the fourth dielectric fin 234 and therefore is disposed over the second interface 2020 as well. As the gate cut openings may reduce the height of the dielectric fins, whenever a gate cut dielectric feature is formed over a dielectric fin, that dielectric fin may have a reduced height. For example, the third dielectric fin 233 has a first height H1 and the fourth dielectric fin 234 has a second height H2 that is smaller than H1. In some instances, the difference between the first height H1 and the second height H2 may be between about 5 nm and about 15 nm.

The cross-sectional view along a line that passes the first dielectric fin 231, the first pass-gate transistor (PG-1) 202, the second dielectric fin 232, the second fin-shaped vertical stack 224, the third dielectric fin 233, the second pull-up transistor (PU-2) 208, the fourth dielectric fin 234, the second pull-down transistor (PD-2) 212, and the fifth dielectric fin 235 of the SRAM cell 200 is similar to the cross-sectional view along line A-A' and will not be repeated here.

Referring now to FIG. 4, illustrated therein is a cross-sectional view of the SRAM cell 200 in FIG. 2 along line B-B'. The line B-B' passes through the dielectric fins (231-235) as well as epitaxial source/drain features of the first pull-down transistor (PD-1) 210, the first pull-up transistor (PU-1) 206, the second pull-up transistor (PU-2) 208, and the second pass-gate transistor (PG-2) 204. These epitaxial source/drain features include n-type epitaxial source/drain features 272 and p-type epitaxial source/drain features 274, each of them is formed from a fin structure. The n-type epitaxial source/drain feature 272 may be different from the p-type epitaxial source/drain feature 274. In some instances, the former may include phosphorous-doped silicon, or other suitable material and the latter may include boron-doped silicon germanium, or other suitable material. For example, n-type epitaxial source/drain features 272 are formed from the first fin structure 22 and the fourth fin structure 28. p-type epitaxial source/drain features 274 are formed from the second fin structure 24 and the third fin structure 26. In embodiments represented in FIG. 4, the first dielectric fin 231, the second dielectric fin 232, the third dielectric fin 233, and the fourth dielectric fin 234 function to separate the epitaxial source/drain features and keep them from touching one another. That is, with the dielectric fins serving as the boundaries to prevent bridging of adjacent epitaxial source/drain features, the epitaxial source/drain features may be allowed to grow to their maximum until they are in contact and restrained by the dielectric fins. In some implementations, each of the n-type epitaxial source/drain features 272 and the p-type epitaxial source/drain features 274 is in contact with adjacent dielectric fins. For example, the n-type epitaxial source/drain feature 272 over the first fin structure 22 may be in direct contact with the first dielectric fin 231 and the second dielectric fin 232. The same may apply to the other n-type epitaxial source/drain features 272 or the p-type epitaxial source/drain features 274.

In some embodiments, the SRAM cell 200 may include source/drain contacts that are electrically coupled to more than one epitaxial source/drain features. In the embodiments illustrated in FIG. 4, the SRAM cell 200 includes a first source/drain contact 282 and a second source/drain contact 284. The first source/drain contact 282 is electrically coupled to the n-type epitaxial source/drain feature 272 over the first fin structure 22 and the p-type epitaxial source/drain feature 274 over the second fin structure 24. The first source/drain contact 282 also spans over and may be in direct contact with the second dielectric fin 232. Similarly, the second source/drain contact 284 is electrically coupled to the p-type epitaxial source/drain feature 274 over the third fin structure 26 and the n-type epitaxial source/drain feature 272 over the fourth fin structure 28. The second source/drain contact 284 spans over and may be in direct contact with the fourth dielectric fin 234. According to the present disclosure, source/drain contacts, such as the first source/drain contact 282 and the second source/drain contact 284, may be formed of titanium, titanium nitride, cobalt, ruthenium, platinum, tungsten, aluminum, copper, or a combination thereof.

As shown in FIG. 5, line C-C' passes through the first pull-down transistor (PD-1) 210, the first pass-gate transistor (PG-1) 202, and their n-type epitaxial source/drain features 272. The first gate stack segments 262 may be lined by a gate spacer 290 over sidewalls of the first gate stack segments 262. The gate spacer 290 may include oxide, nitrogen-doped silicon oxide, porous oxide, or a combination thereof. In addition, in some embodiments represented in FIG. 5, the first gate stack segments 262 may be capped and protected by a capping layer 300. The material for the capping layer 300 may be selected from a group consisting of silicon oxide, silicon oxycarbide, silicon oxynitride, silicon oxycarbonitride, hafnium oxide, tantalum oxide, titanium oxide, zirconium oxide, aluminum oxide, yttrium oxide, other suitable nitride dielectric material, or other suitable metal oxides. The n-type epitaxial source/drain features 272 may be electrically coupled to respectively source/drain contacts, including the third source/drain contact 286, the first source/drain contact 282, and the fourth source/drain contact 288. In some embodiments, the n-type epitaxial source/drain features 272 may be electrically coupled to respectively source/drain contacts via a silicide layers 280. In some implementations, top surfaces of the source/drain contacts (286, 282 and 288) and the capping layers 300 may be planarized by, for example, etching, grinding or chemical mechanical polishing (CMP). A dielectric layer 310 may be formed over the planarized source/drain contacts and capping layers 300. As illustrated in FIG. 5, the first channel members 242 of the first pull-down transistor (PD-1) 210 and the first pass-gate transistor (PG-1) 202 are also coupled to the n-type epitaxial source/drain features 272. In some embodiments, inner spacers 292 are formed partially into the space between adjacent first channel members 242 to reduce capacitance and prevent leakage.

Referring now to FIG. 6, illustrated therein is a cross-sectional view of the SRAM cell 200 in FIG. 2 along line D-D'. As shown in FIG. 6, line D-D' passes through the first pull-up transistor (PU-1) 206 and its p-type epitaxial source/drain features 274. The second gate stack segments 264 may be lined by a gate spacer 290 over sidewalls of the second gate stack segments 264. In addition, in some embodiments represented in FIG. 6, the second gate stack segments 264 may be capped and protected by the capping layer 300. The p-type epitaxial source/drain features 274 may be electrically coupled to respectively source/drain contacts, including the fifth source/drain contact 285 and the first source/drain contact 282. In some embodiments, the p-type epitaxial source/drain features 274 may be electrically coupled to respectively source/drain contacts via a silicide layers 280. In some implementations, top surfaces of the source/drain contacts (285 and 282) and the capping layers 300 may be planarized by, for example, etching, grinding or chemical mechanical polishing (CMP). The dielectric layer 310 may be formed over the planarized source/drain contacts and capping layers 300. As illustrated in FIG. 6, the second channel members 246 of the first pull-up transistor (PU-1) 206 are also coupled to the p-type epitaxial source/drain features 274. In some embodiments, inner spacers 292 are formed partially into the space between adjacent second channel members 246 to reduce capacitance and prevent leakage.

Figure 8:
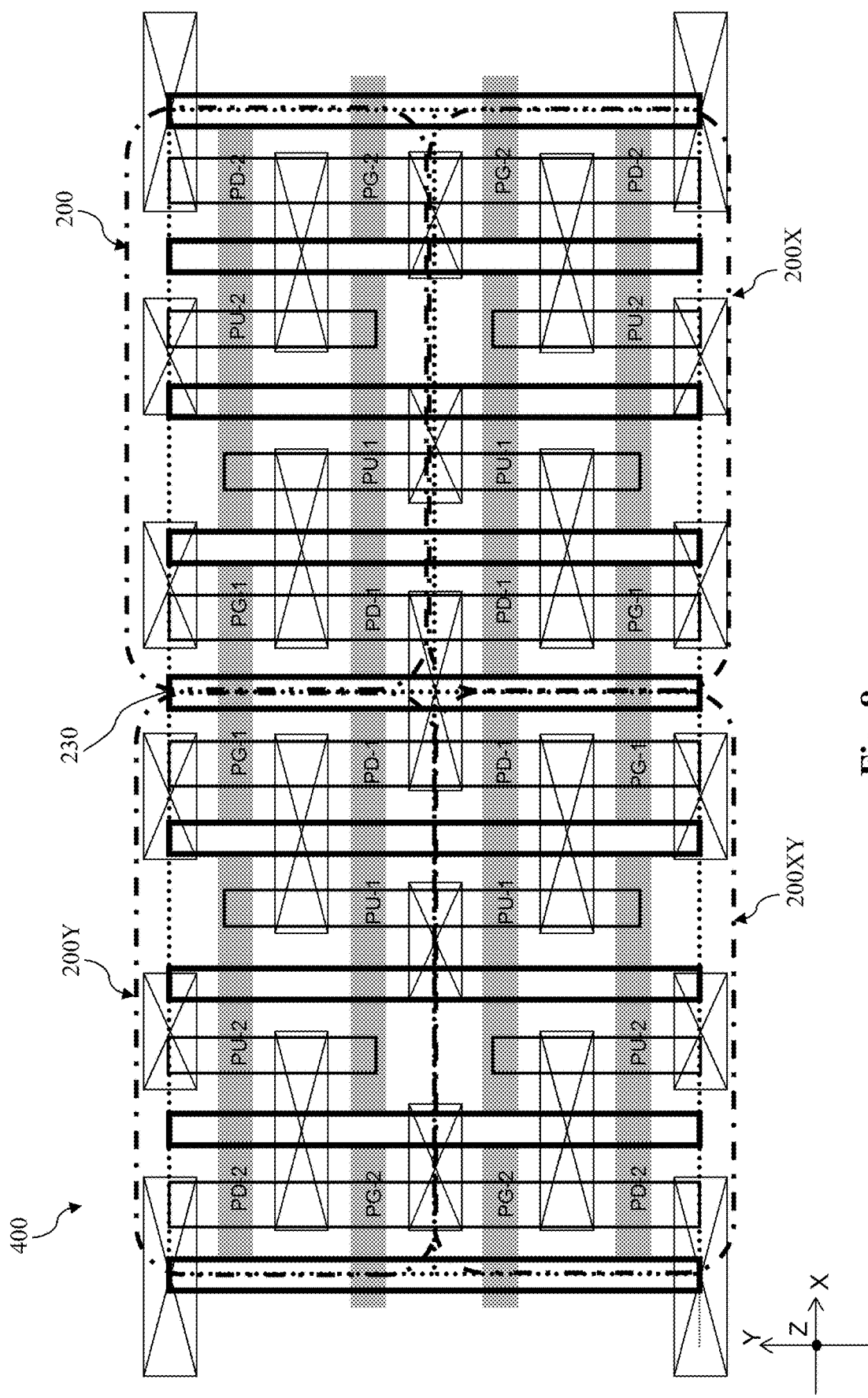
FIG. 8 illustrates a simplified fragmentary layout of an SRAM macro in accordance with some embodiments of the present disclosure.

In some instances, a plurality of SRAM cells can be connected together to form SRAM macros. For example, a 32 by 32 (32×32) array of SRAM cells can constitute a 1K bit SRAM Marco and a 256 by 32 (256×32) array of SRAM cells can form an 8K bit SRAM macro. When SRAM cells are arranged together to form an array, the SRAM cell layouts may be flipped or rotated to enable higher packing densities. The flipping and rotation allows adjacent SRAM cells to share common connections, common P wells, or common N-wells. Reference is now made to FIG. 8. FIG. 8 shows a fragmentary simplified layout of an SRAM macro 400 that includes SRAM cells similar to the SRAM cell 100 in FIG. 2 or the SRAM cell 200 in FIGS. 3-6. For ease of illustration, only four SRAM cells of the SRAM macro 400 are shown in FIG. 8 and each of the four SRAM cells is illustrated as a configuration/orientation of the SRAM cell 200 in FIGS. 3-6. Specifically, the SRAM cell 200X is a mirror image of the SRAM cell 200 across the X axis; the SRAM cell 200Y is a mirror image of the SRAM cell 200 across the Y axis; and the SRAM cell 200XY is a mirror image of the SRAM cell 200X across the Y axis or the SRAM cell 200Y across the X axis. Most notably, because the SRAM cell 200 and the SRAM cell 200Y share the dielectric fin 230, the SRAM cell 200 is a mirror image of the SRAM cell 200Y across the dielectric fin 230 and vice versa. The dielectric fin 230 extends from and rises above an isolation feature (similar to the isolation feature 203 in FIGS. 3-6) disposed between the SRAM cell 200 and the SRAM cell 200Y. Similarly, because the SRAM cell 200X and the SRAM cell 200XY share the dielectric fin 230, the SRAM cell 200X is a mirror image of the SRAM cell 200XY across the dielectric fin 230 and vice versa. The dielectric fin 230 extends from and rises above an isolation feature (similar to the isolation feature 203 in FIGS. 3-6) disposed between the SRAM cell 200X and the SRAM cell 200XY.

Based on the above discussions, it can be seen that the present disclosure offers advantages over conventional SRAM cells and SRAM macros. It is understood, however, that other embodiments may offer additional advantages, and not all advantages are necessarily disclosed herein, and that no particular advantage is required for all embodiments. The present disclosure provides embodiments of a 6T SRAM cell formed of GAA transistors. The 6T SRAM cell of the present disclosure includes four fin-shaped vertical stacks interleaved by five dielectric fins. The dielectric fins serve to prevent bridging of adjacent epitaxial source/drain features, facilitate different work function metal arrangements in different device regions, and control the metal gate cut processes.

The disclosure of the present disclosure provides embodiments of SRAM cells and memory structures. In one embodiment, an SRAM cell is provided. The SRAM cell includes a first pull-up gate-all-around (GAA) transistor and a first pull-down GAA transistor coupled together to form a first inverter, a second pull-up GAA transistor and a second pull-down GAA transistor coupled together to form a second inverter, a first pass-gate GAA transistor coupled to an output of the first inverter and an input of the second inverter, a second pass-gate GAA transistor coupled to an output of the second inverter and an input of the first inverter, a first dielectric fin disposed between the first pull-up GAA transistor and the first pull-down GAA transistor, and a second dielectric fin disposed between the second pull-up GAA transistor and the second pull-down GAA transistor.

In some embodiments, the first dielectric fin and the second dielectric fin include silicon oxycarbide, silicon oxynitride, silicon oxycarbonitride, silicon nitride, aluminum oxide, yttrium oxide, tantalum oxide, titanium oxide, hafnium oxide, or zirconium oxide. In some implementations, each of the first dielectric fin and the second dielectric fin includes a first layer and a second layer disposed in the first layer, the first layer includes silicon nitride, and the second layer includes aluminum oxide, yttrium oxide, tantalum oxide, titanium oxide, hafnium oxide, zirconium oxide, or a combination thereof. In some instances, the first pull-up GAA transistor includes a first source/drain feature disposed over a first fin structure, the first pull-down GAA transistor includes a second source/drain feature disposed over a second fin structure, the first dielectric fin is disposed between the first source/drain feature and the second source/drain feature. In some embodiments, an isolation feature is disposed between the first fin structure and the second fin structure and the first dielectric fin includes a lower portion and an upper portion above the lower portion. In those embodiments, the lower portion of the first dielectric fin is disposed in the isolation feature and the upper portion of the first dielectric fin extends above the isolation feature. In some implementations, the first dielectric fin is in contact with the first source/drain feature and the second source/drain feature. In some implementations, the first pass-gate GAA transistor and the first pull-down GAA transistor are disposed over a first p-type well; the first pull-up GAA transistor and the second pull-up GAA transistor are disposed over an n-type well; the second pass-gate GAA transistor and the second pull-down GAA transistor are disposed over a second p-type well; the first dielectric fin is disposed over a first interface between the first p-type well and the n-type well; and the second dielectric fin is disposed over a second interface between the second p-type well and the n-type well. In some embodiments, the SRAM cell further includes a gate cut dielectric feature over the second dielectric fin. In those embodiments, the gate cut dielectric feature is formed of a dielectric material having a dielectric constant greater than 3.9.

In another embodiment, an SRAM cell is provided. The SRAM cell includes a first fin-shaped vertical stack over a first p-type well, a second fin-shaped vertical stack over an n-type well adjacent the first p-type well, a third fin-shaped vertical stack over the n-type well, a fourth fin-shaped vertical stack over a second p-type well adjacent the n-type well, a first dielectric fin between the first fin-shaped vertical stack and the second fin-shaped vertical stack, a second dielectric fin between the second fin-shaped vertical stack and the third fin-shaped vertical stack, and a third dielectric fin between the third fin-shaped vertical stack and the fourth fin-shaped vertical stack.

In some embodiments, the first fin-shaped vertical stack includes a first pass-gate GAA transistor and a first pull-down GAA transistor; the second fin-shaped vertical stack includes a first pull-up GAA transistor; the third fin-shaped vertical stack includes a second pull-up GAA transistor; and the fourth fin-shaped vertical stack includes a second pass-gate GAA transistor and a second pull-down GAA transistor. In some implementations, the SRAM cell further includes a fourth dielectric fin adjacent to the first fin-shaped vertical stack and a fifth dielectric fin adjacent to the fourth fin-shaped vertical stack. In some implementations, the fourth dielectric fin and the fifth dielectric fin define two ends of the SRAM cell. In some embodiments, the SRAM cell further includes an isolation feature among the first fin-shaped vertical stack, the second fin-shaped vertical stack, the third fin-shaped vertical stack, and the fourth fin-shaped vertical stack. In those embodiments, each of the first dielectric fin, the second dielectric fin, and the third dielectric fin is disposed over the isolation feature. In some implementations, each of the first fin-shaped vertical stack and the fourth fin-shaped vertical stack includes a first width (W1), each of second fin-shaped vertical stack and the third fin-shaped vertical stack includes a second width (W2), and a ratio (W1/W2) of the first width W1 to the second width W2 is between about 1.1 and about 3.0. In some instances, each of the first dielectric fin, the second dielectric fin, and the third dielectric fin includes one or more dielectric materials selected from a group consisting of silicon oxycarbide, silicon oxynitride, silicon oxycarbonitride, silicon nitride, aluminum oxide, yttrium oxide, titanium oxide, tantalum oxide, hafnium oxide, and zirconium oxide.

In a further embodiment, a memory structure is provided. The memory structure includes a first SRAM cell including a first plurality of gate-all-around (GAA) transistors, a second SRAM cell including a second plurality of GAA transistors, and a dielectric fin between the first SRAM cell and the second SRAM cell. In this embodiment, the first SRAM cell is a mirror image of the second SRAM cell divided by the dielectric fin.

In some embodiments, the dielectric fin is disposed over an isolation feature between the first SRAM cell and the second SRAM cell. In some implementations, the dielectric fin is disposed over a p-type well. In some instances, the first SRAM cell and the second SRAM cell share the p-type well.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit-line conductor and word line conductor, one can achieve different resistances for the conductors. However, other techniques to vary the resistances of the metal conductors may also be utilized as well.

What is claimed is:
1. A memory structure, comprising:
 a first Static Random Access Memory (SRAM) cell comprising
  a first fin-shaped vertical stack over a first p-type well, the first fin-shaped vertical stack comprising a first plurality of nanostructures stacked one over another,
  a second fin-shaped vertical stack over an n-type well adjacent the first p-type well, the second fin-shaped vertical stack comprising a second plurality of nanostructures stacked one over another, a third fin-shaped vertical stack over the n-type well, the third fin-shaped vertical stack comprising a third plurality of nanostructures stacked one over another, a fourth fin-shaped vertical stack over a second p-type well adjacent the n-type well, the fourth fin-shaped vertical stack comprising a fourth plurality of nanostructures stacked one over another, a first dielectric fin between the first fin-shaped vertical stack and the second fin-shaped vertical stack, a second dielectric fin between the second fin-shaped vertical stack and the third fin-shaped vertical stack, and a third dielectric fin between the third fin-shaped vertical stack and the fourth fin-shaped vertical stack.

2. The memory structure of claim 1,
wherein the first dielectric fin is disposed directly over an interface between the first p-type well and the n-type well, and
wherein the third dielectric fin is disposed directly over an interface between the n-type well and the second p-type well.

3. The memory structure of claim 1, further comprising:
a fourth dielectric fin adjacent to the fourth fin-shaped vertical stack; and
a dielectric gate cut feature disposed on and vertically aligned with the third dielectric fin,
wherein the fourth dielectric fin is disposed over the second p-type well.

4. The memory structure of claim 3, where each of the first dielectric fin, the second dielectric fin, the third dielectric fin, and the fourth dielectric fin comprises one or more dielectric materials selected from a group consisting of silicon oxycarbide, silicon oxynitride, silicon oxycarbonitride, silicon nitride, aluminum oxide, yttrium oxide, titanium oxide, tantalum oxide, hafnium oxide, and zirconium oxide.

5. The memory structure of claim 3, further comprising:
a second SRAM cell,
wherein the second SRAM cell is a mirror image of the first SRAM cell with respect to the fourth dielectric fin.

6. The memory structure of claim 5, wherein the first SRAM cell and the second SRAM cell share the second p-type well.

7. A Static Random Access Memory (SRAM) cell, comprising:
a first fin-shaped vertical stack over a first p-type well, the first fin-shaped vertical stack comprising a first plurality of nanostructures stacked one over another;
a second fin-shaped vertical stack over an n-type well adjacent the first p-type well, the second fin-shaped vertical stack comprising a second plurality of nanostructures stacked one over another;
a third fin-shaped vertical stack over the n-type well, the third fin-shaped vertical stack comprising a third plurality of nanostructures stacked one over another;
a fourth fin-shaped vertical stack over a second p-type well adjacent the n-type well, the fourth fin-shaped vertical stack comprising a fourth plurality of nanostructures stacked one over another;
a first dielectric fin between the first fin-shaped vertical stack and the second fin-shaped vertical stack;
a second dielectric fin between the second fin-shaped vertical stack and the third fin-shaped vertical stack; and
a third dielectric fin between the third fin-shaped vertical stack and the fourth fin-shaped vertical stack.

8. The SRAM cell of claim 7,
wherein the first fin-shaped vertical stack includes a first pass-gate transistor and a first pull-down transistor,
wherein the second fin-shaped vertical stack includes a first pull-up transistor,
wherein the third fin-shaped vertical stack includes a second pull-up transistor,
wherein the fourth fin-shaped vertical stack includes a second pass-gate transistor and a second pull-down transistor.

9. The SRAM cell of claim 7, further comprising:
a fourth dielectric fin adjacent to the first fin-shaped vertical stack; and
a fifth dielectric fin adjacent to the fourth fin-shaped vertical stack.

10. The SRAM cell of claim 9, wherein the fourth dielectric fin and the fifth dielectric fin define two ends of the SRAM cell.

11. The SRAM cell of claim 9, wherein the fifth dielectric fin is disposed over the second p-type well.

12. The SRAM cell of claim 9, further comprising:
a first gate cut dielectric feature disposed on the fourth dielectric fin; and
a second gate cut dielectric feature disposed on the third dielectric fin.

13. The SRAM cell of claim 7, further comprising:
an isolation feature among the first fin-shaped vertical stack, the second fin-shaped vertical stack, the third fin-shaped vertical stack, and the fourth fin-shaped vertical stack,
wherein each of the first dielectric fin, the second dielectric fin, and the third dielectric fin is disposed over the isolation feature.

14. The SRAM cell of claim 7, where each of the first dielectric fin, the second dielectric fin, and the third dielectric fin comprises one or more dielectric materials selected from a group consisting of silicon oxycarbide, silicon oxynitride, silicon oxycarbonitride, silicon nitride, aluminum oxide, yttrium oxide, titanium oxide, tantalum oxide, hafnium oxide, and zirconium oxide.

15. The SRAM cell of claim 7, wherein the first dielectric fin is disposed directly over an interface between the first p-type well and the n-type well.

16. The SRAM cell of claim 7, wherein the third dielectric fin is disposed directly over an interface between the n-type well and the second p-type well.

17. A memory cell, comprising:
a first vertical stack of nanostructures over a first p-type well;
a second vertical stack of nanostructure over an n-type well adjacent the first p-type well;
a third vertical stack of nanostructures over the n-type well;
a fourth vertical stack of nanostructures over a second p-type well adjacent the n-type well;
a first dielectric fin between the first vertical stack of nanostructures and the second vertical stack of nanostructures;
a second dielectric fin between the second vertical stack of nanostructures and the third vertical stack of nanostructures; and
a third dielectric fin between the third vertical stack of nanostructures and the fourth vertical stack of nanostructures.

18. The memory cell of claim 17, wherein each of the first dielectric fin, the second dielectric fin, and the third dielectric fin comprises:

a first layer; and a second layer disposed in the first layer, wherein a composition of the first layer is different from a composition of the second layer.

19. The memory cell of claim 18, wherein each of the first dielectric fin, the second dielectric fin, and the third dielectric fin further comprises a cap layer disposed on the first layer and the second layer.

20. The memory cell of claim 17, further comprising:

a fourth dielectric fin adjacent to the fourth vertical stack of nanostructures, wherein the fourth dielectric fin is disposed over the second p-type well.

* * * * *